United States Patent
Conway et al.

(10) Patent No.: US 10,985,322 B2
(45) Date of Patent: Apr. 20, 2021

(54) POLYMER AND ORGANIC LIGHT-EMITTING DEVICE

(75) Inventors: Natasha M. J. Conway, Cambridgeshire (GB); Jonathan Pillow, Stotfold (GB); Thomas Pounds, Cambridgeshire (GB); Fredrik Jakobsson, Cambridgeshire (GB); Christian Nielsen, London (GB)

(73) Assignees: Cambridge Display Technology, Ltd., Godmanchester (GB); Sumitomo Chemical Company Limited, Tokyo (JP)

(*) Notice: Subject to any disclaimer, the term of this patent is extended or adjusted under 35 U.S.C. 154(b) by 1213 days.

(21) Appl. No.: 13/879,503

(22) PCT Filed: Oct. 13, 2011

(86) PCT No.: PCT/GB2011/001480
§ 371 (c)(1),
(2), (4) Date: Jul. 25, 2013

(87) PCT Pub. No.: WO2012/049462
PCT Pub. Date: Apr. 19, 2012

(65) Prior Publication Data
US 2013/0292657 A1 Nov. 7, 2013

(30) Foreign Application Priority Data
Oct. 15, 2010 (GB) .................................... 1017467

(51) Int. Cl.
*H01L 51/50* (2006.01)
*H01L 51/54* (2006.01)
*H01L 51/00* (2006.01)
*C09K 11/06* (2006.01)

(52) U.S. Cl.
CPC ......... *H01L 51/0043* (2013.01); *C09K 11/06* (2013.01); *H01L 51/0035* (2013.01); *C09K 2211/1416* (2013.01); *C09K 2211/1425* (2013.01); *C09K 2211/1433* (2013.01); *H01L 51/0039* (2013.01); *H01L 51/5012* (2013.01)

(58) Field of Classification Search
CPC ............. H01L 51/0043; H01L 51/0035; H01L 51/0039; H01L 51/5012; C09K 11/06; C09K 2211/1433; C09K 2211/1416; C09K 2211/1425; C08G 61/12; C08G 61/122; C08G 2261/124; C08G 2261/3142; C08G 2261/316; C08G 2261/31; C08G 2261/312; C08G 2261/3241; C08G 2261/36; C08G 2261/411; C08G 2261/412; C08G 2261/5222; C08G 2261/5242
USPC ..... 428/690, 691, 917, 411.433; 427/58, 66; 313/500–512; 257/40, 88–104, 257/E51.001–51.052; 252/301.16–301.35
See application file for complete search history.

(56) References Cited

U.S. PATENT DOCUMENTS

| | | | |
|---|---|---|---|
| 6,268,072 B1 * | 7/2001 | Zheng | C09K 11/06 313/504 |
| 6,353,083 B1 * | 3/2002 | Inbasekaran | C08G 61/02 528/295 |
| 6,361,887 B1 * | 3/2002 | Shi | C08G 65/40 313/504 |
| 2001/0053462 A1 * | 12/2001 | Mishima | C09K 11/06 428/690 |
| 2005/0095456 A1 * | 5/2005 | Takeda | C09K 11/06 428/690 |
| 2006/0121314 A1 * | 6/2006 | Choi | C08G 61/02 428/690 |
| 2006/0199943 A1 * | 9/2006 | Falcou | C08G 61/02 528/422 |
| 2007/0034832 A1 * | 2/2007 | O'Dell | C08G 61/10 252/301.35 |
| 2007/0145886 A1 * | 6/2007 | Aziz | H01L 51/52 313/504 |
| 2007/0244295 A1 | 10/2007 | Fujita | |
| 2009/0066238 A1 | 3/2009 | Chen et al. | |
| 2010/0029886 A1 * | 2/2010 | Steudel | C07C 211/61 528/8 |

(Continued)

FOREIGN PATENT DOCUMENTS

| | | |
|---|---|---|
| EP | 1 281 745 A1 | 2/2003 |
| EP | 1 310 539 A1 | 5/2003 |
| EP | 1 840 182 A2 | 10/2007 |

(Continued)

OTHER PUBLICATIONS

Montalti et al., Handbook of Photochemistry 3rd edition, 2006, CRC Press, pp. 83-351.*
Pina et al., "On the triplet state of poly(N-vinylcarbazole)", 2004, Chemical Physics Letters, vol. 400, pp. 441-445.*
Togashi et al., Machine Translation of JP 2009-079092, Date of orginal Japanese language publication: 2009, pp. 1-90.*
Zhan et al., "Synthesis and Fluorescence of Polymeric Triphenylamine Obtained by Oxidative-Coupling Polymerization", Journal of Applied Polymer Science, 2002, vol. 85, pp. 2718-2724.*

(Continued)

*Primary Examiner* — Dylan C Kershner
(74) *Attorney, Agent, or Firm* — Wolf, Greenfield & Sacks, P.C.

(57) ABSTRACT

Light-emitting composition and devices including the same, the composition including a fluorescent light-emitting material and a polymer having a conjugating repeat unit and a non-conjugating repeat unit in a backbone of the polymer, and in which the conjugating repeat unit provides at least one conjugation path between repeat units linked to it; the non-conjugating repeat unit reduces conjugation of the polymer as compared to a polymer in which the non-conjugating repeat unit is absent; and a triplet excited state energy level of the light-emitting material is higher than a triplet excited state energy level of the non-conjugating repeat unit.

12 Claims, 3 Drawing Sheets

(56) References Cited

U.S. PATENT DOCUMENTS

| | | | | |
|---|---|---|---|---|
| 2010/0051869 A1* | 3/2010 | Chichak | ............ | C07F 15/0033 252/301.16 |
| 2010/0176718 A1* | 7/2010 | Jung | ............ | C08G 61/12 313/504 |
| 2011/0108814 A1* | 5/2011 | Iida | ............ | C08G 61/12 257/40 |

FOREIGN PATENT DOCUMENTS

| | | | |
|---|---|---|---|
| EP | 2 110 399 A1 | 10/2009 | |
| JP | 2009079092 A * | 4/2009 | |
| JP | WO 2009123269 A1 * | 10/2009 | ............ C08G 61/12 |
| WO | WO 00/55927 A1 | 9/2000 | |
| WO | WO 2007/072741 A1 | 6/2007 | |
| WO | WO 2010/119276 A1 | 10/2010 | |

OTHER PUBLICATIONS

Pang et al. "A Processible Poly(phenyleneethynylene) with Strong Photoluminescence: Synthesis and Characterization of Poly[(m-phenyleneethynylene)-alt-(p-phenyleneethynylene)]," Macromolecules, vol. 31, 1998, pp. 6730-6732. (Year: 1998).*
Hong et al. "Origin of the Broken Conjugation in m-Phenylene Linked Conjugated Polymers," Macromolecules (2001) vol. 34, pp. 6474-6481. (Year: 2001).*
Khotina et al. "Star-like Aromatic Conjugated Polymers and Dendrimers for OLEDs" Materials Research Society Symposium Proceedings (2004) vol. 785, pp. 1-6. (Year: 2004).*
Mikroyannidis, "Synthesis and Properties of Soluble, Fluorescent Polyesters and Polyethers with Substituted m-Terphenyl Segments in the Main Chain" Journal of Polymer Science Part A: Polymer Chemistry (2000) vol. 38, Issue 13, pp. 2381-2391. (Year: 2000).*
Kang et al., "Correlation of photoluminescent quantum efficiency and device characteristics for the soluble electrophosphorescent light emitter with interfacial layers", Journal of Applied Physics, (2008) vol. 104, 024511, pp. 2-9. (Year: 2008).*
Mei et al., "Synthesis and Characterization of White-Light-Emitting Polyfluorenes Containing Orange Phosphorescent Moieties in the Side Chain" Journal of Polymer Science: Part A: Polymer Chemistry, vol. 45 (2007) pp. 1746-1757. (Year: 2007).*
International Search Report and Written Opinion dated Jan. 11, 2012 for Application No. PCT/GB2011/001480.
International Preliminary Report on Patentability dated Apr. 16, 2013 for Application No. PCT/GB2011/001480.
Becker et al., Optimisation of polyfluorenes for light emitting applications. Synthetic Metals. 2002; 125(1):73-80.
Ego et al., Attaching perylene dyes to polyfluorene: three simple, efficient methods for facile color tuning of light-emitting polymers. J Am Chem Soc. Jan. 15, 2003;125(2):437-43.
Klärner et al., Exciton Migration and Trapping in Copolymers Based on Dialkylfluorenes. Advanced Materials. 1999; 11(2): 115-9.
Lee et al., Color tuning in polyfluorenes by copolymerization with low band gap comonomers. Synthetic Metals. 1999; 102(1-3):1087-88.

* cited by examiner

POLYMER AND ORGANIC LIGHT-EMITTING DEVICE

RELATED APPLICATIONS

The present application is a national stage filing under 35 U.S.C. § 371 of international PCT application, PCT/GB2011/001480, filed Oct. 13, 2011, which claims priority to United Kingdom patent application, GB 1017467.0, filed Oct. 15, 2010, each of which is incorporated herein by reference.

SUMMARY OF THE INVENTION

This invention relates to charge transporting and light-emitting polymers, in particular for use in organic light-emitting devices.

BACKGROUND OF THE INVENTION

Electronic devices comprising active organic materials are attracting increasing attention for use in devices such as organic light emitting diodes, organic photoresponsive devices (in particular organic photovoltaic devices and organic photosensors), organic transistors and memory array devices. Devices comprising organic materials offer benefits such as low weight, low power consumption and flexibility. Moreover, use of soluble organic materials allows use of solution processing in device manufacture, for example inkjet printing or spin-coating.

With reference to FIG. 1, an organic light-emitting device (OLED) may comprise a substrate 1 carrying an anode 2, a cathode 4 and an organic light-emitting layer 3 between the anode and cathode comprising a light-emitting material.

In operation, holes are injected into the device through the anode 2 and electrons are injected through the cathode 4 during operation of the device. Holes and electrons combine in the light-emitting layer to form an exciton that releases its energy as light. The colour of light emitted from the device depends, at least in part, on the HOMO-LUMO bandgap (that is, the highest occupied molecular orbital—lowest unoccupied molecular orbital bandgap) of the light emitting material.

Suitable light-emitting materials include small molecule, polymeric and dendrimeric materials. Suitable light-emitting polymers for use in layer 3 include conjugated polymers (that is, polymers in which adjacent repeat units in the polymer backbone are conjugated together) for example poly(arylene vinylenes) such as poly(p-phenylene vinylenes) and polyarylenes such as polyfluorenes.

Alternatively or additionally, the light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton) and Appl. Phys. Lett., 2000, 77, 904 discloses a host material doped with a phosphorescent light emitting dopant (that is, a light-emitting material in which light is emitted via decay of a triplet exciton). In order to function effectively as a host it is necessary for the relevant excited state energy level of the host material to be higher than that of the luminescent dopant that the host is to be used with (for example, the singlet excited state energy level $S_1$ for a fluorescent emitter and the triplet excited state energy level $T_1$ for a phosphorescent emitter).

Use of a conjugated polymer, either as a light-emitting material or as a host material, may offer numerous advantageous properties such as polymer solubility, enabling the material to be deposited by solution coating or printing techniques such as spin-coating or inkjet printing, and high conductivity.

However, conjugation between adjacent repeat units of a conjugated polymer has the effect of lowering the excited state energy levels of the polymer as compared to the excited state energy levels of the monomers from which those repeat units are derived; for example, conjugating a plurality of fluorene units together creates a conjugated chain with a lower excited state energy level than that of the isolated repeat units. Accordingly, the presence of extended conjugation along the backbone of a polymer may limit the colour of emission that is achievable with that polymer, in particular at the short wavelength (blue) end of the visible spectrum, and/or the range of light-emitting dopants that the polymer can function as a host for.

WO 2005/013386 discloses an organic light-emitting device comprising a host polymer material and a luminescent metal complex wherein the polymer material may comprise partially or fully non-conjugated repeat units.

WO 02/066537 discloses conjugated polymers comprising repeat units that are twisted out of the plane of the polymer backbone in order to reduce stacking between polymer chains and decrease conjugation of the polymer.

WO 02/26856 discloses polymers comprising repeat units of formula (I):

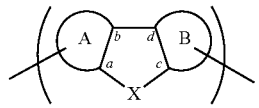

wherein X is such that there is a torsion angle of at least 5° between the bond a-b and the bond c-d about the bond b-d.

Separately, it has been postulated that the presence of triplet excitons, which may have relatively long-lived triplet excited states, can be detrimental to OLED lifetime as a result of triplet-triplet or triplet-singlet interactions (OLED lifetime as used herein means the length of time taken for the luminance of the OLED at constant current to fall by 50% from an initial luminance value).

US 2007/145886 discloses an OLED comprising a triplet-quenching material to prevent or reduce triplet-triplet or triplet-singlet interactions.

SUMMARY OF THE INVENTION

In a first aspect the invention provides a light-emitting composition including a fluorescent light-emitting material and comprising a polymer comprising a conjugating repeat unit and a non-conjugating repeat unit in a backbone of the polymer, wherein:

the conjugating repeat unit provides at least one conjugation path between repeat units linked thereto;

the non-conjugating repeat unit reduces conjugation of the polymer as compared to a polymer in which the non-conjugating repeat unit is absent; and a triplet excited state energy level of the light-emitting material is higher than a triplet excited state energy level of the non-conjugating repeat unit.

Optionally, the non-conjugating repeat unit does not provide any conjugation path between repeat units linked thereto.

Optionally, the fluorescent light-emitting material is a repeat unit of the polymer.

Optionally, the fluorescent light-emitting repeat unit of the polymer comprises a repeat unit of formula (V):

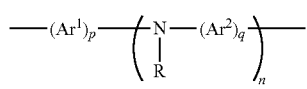

(V)

wherein $Ar^1$ and $Ar^2$ in each occurrence are independently selected from optionally substituted aryl or heteroaryl, n is greater than or equal to 1, preferably 1 or 2, R is H or a substituent, preferably a substituent, p and q are each independently 1, 2 or 3, and any aryl or heteroaryl groups of the repeat unit of formula (V) may be linked to one another by a direct bond or a divalent group.

Optionally, R is $—(Ar^3)_r$ wherein each $Ar^3$ independently represents an optionally substituted aryl or heteroaryl group and r is at least 1.

Optionally, the non-conjugating repeat unit is linked to adjacent repeat units such that that there is no conjugating path of alternating saturated and unsaturated bonds between the adjacent repeat units.

Optionally, the non-conjugating repeat unit comprises at least one $sp^3$ hybridised carbon atom in at least one path between the repeat units that the non-conjugating repeat unit is linked to.

Optionally, the non-conjugating repeat unit is twisted out of the plane of at least one adjacent repeat unit.

Optionally, the conjugating repeat unit comprises an optionally substituted arylene repeat unit.

Optionally, the conjugating repeat unit comprises a repeat unit of formula (IV):

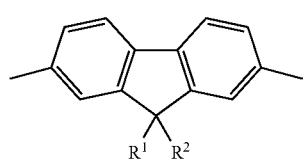

(IV)

wherein $R^1$ and $R^2$ are independently H or a substituent and wherein $R^1$ and $R^2$ may be linked to form a ring.

Optionally, the non-conjugating repeat unit does not comprise perylene.

Optionally, the non-conjugating repeat unit comprises the fluorescent light-emitting material.

Optionally, the fluorescent light-emitting material comprises a repeat unit of formula (V) and wherein R comprises a triplet-quenching group.

Optionally, the non-conjugating repeat units comprise at least 5 mol %, preferably at least 10 mol %, of the total number of repeat units in the polymer.

Optionally, the polymer comprises at least two different conjugating repeat units.

Optionally, the polymer comprises at least two different non-conjugating repeat units.

In a second aspect the invention provides an organic light-emitting device comprising an anode, a cathode and a light-emitting layer between the anode and the cathode wherein the light-emitting layer comprises a light-emitting composition according to the first aspect.

In a third aspect the invention provides a method of forming a light-emitting composition according to the first aspect comprising the steps of polymerising a polymerisation mixture comprising a monomer comprising a conjugating unit and a monomer comprising a non-conjugating unit.

Optionally, the polymerisation mixture comprises a monomer comprising a light-emitting unit.

Optionally, the polymerisation is a metal insertion polymerisation wherein each monomer comprises at least two leaving groups capable of participating in the metal insertion polymerisation.

Optionally, each leaving group is independently selected from halogen, preferably bromine or iodine; a boronic acid or an ester thereof; and a sulfonic acid or a derivative thereof.

In a fourth aspect the invention provides use of a non-conjugating, triplet quenching repeat unit in a polymer to quench triplet excitons in a light-emitting composition and to reduce conjugation of the polymer as compared to a polymer in which the non-conjugating repeat unit is absent, the light-emitting composition including a fluorescent light-emitting material and comprising a polymer comprising a conjugating repeat unit and the non-conjugating, triplet quenching repeat unit in a backbone of the polymer, wherein:

the conjugating repeat unit provides at least one conjugation path between repeat units linked thereto; and a triplet excited state energy level of the light-emitting material is higher than a triplet excited state energy level of the non-conjugating, triplet quenching repeat unit.

DESCRIPTION OF THE DRAWINGS

The invention will now be described in more detail with reference to the drawings in which.

DETAILED DESCRIPTION OF THE INVENTION

Figure 2:
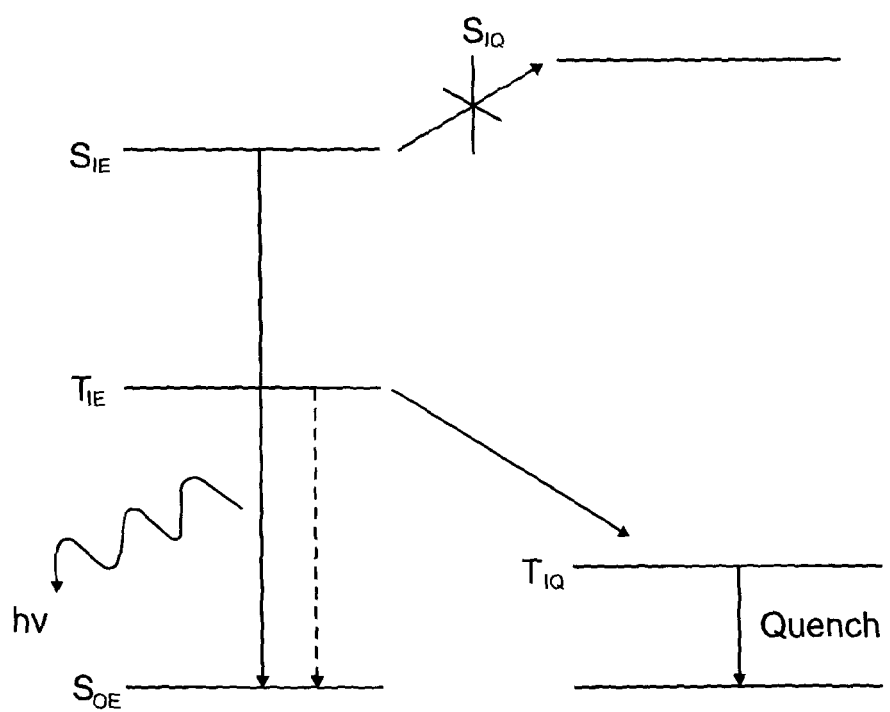
FIG. 2 is an energy transfer diagram illustrating emission of light from a fluorescent OLED and quenching of triplet excitons.

FIG. 2 illustrates an energy transfer mechanism for an OLED comprising an light emitting polymer (that is, a polymer comprising light-emitting repeat units) wherein the light-emitting polymer has a singlet excited state energy level $S_{1E}$ and a singlet ground state energy level $S_{0E}$. For the avoidance of any doubt, energy levels are not drawn to any scale.

Figure 1:
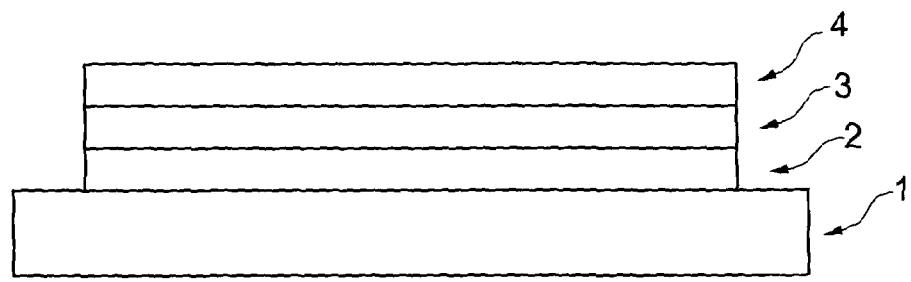
FIG. 1 schematically illustrates an organic light-emitting device.

Singlet excitons having energy $S_{1E}$ decay by emission of fluorescent light hv, illustrated by the solid arrow between $S_{1E}$ and $S_{0E}$ in FIG. 1, however triplet excitons having energy $T_{1E}$ may not radiatively decay to $S_{0E}$ because this process is spin-forbidden. Consequently, triplet excitons may build up and triplet-triplet exciton interactions or triplet-singlet exciton) interactions may create "super-excited" states on the light-emitting polymer. Without wishing to be bound by any theory, it is believed that formation of these highly energetic super-excited states on the light emitting polymer may be detrimental to OLED lifetime. By providing a triplet quenching unit having an excited triplet state energy level $T_{1O}$ that is lower than $T_{1E}$, it is possible for triplet excitons to be transferred for quenching to the triplet accepting unit.

However, the present inventors have found that the lifetime of a fluorescent OLED composition including a polymer containing conjugating units and non-conjugating units is significantly reduced as compared to a light-emitting polymer without non-conjugating units even if the light-emitting polymer is blended with a triplet quenching material.

Moreover, the present inventors have found that OLEDs comprising polymers with non-conjugating units have a relatively high triplet exciton density as compared to OLEDs comprising light-emitting polymers without said non-conjugating units.

Without wishing to be bound by any theory, it is believed that triplet excitons are able to move relatively freely along a conjugated polymer chain (the triplet exciton diffusion being governed by Dexter transfer), but become trapped on the polymer chain when reaching a break in conjugation. Consequently, blending a triplet quenching material blended with a polymer comprising non-conjugating units is not as effective in increasing OLED lifetime as compared to an OLED comprising a polymer without the non-conjugating units because the triplet excitons on a polymer comprising non-conjugating units have a slower diffusion rate and so are less likely to encounter the triplet quenching material.

In order to increase the likelihood of triplet excitons encountering a triplet quenching material, the present invention provides a conjugated polymer comprising repeat units that both reduce or break conjugation along the polymer backbone and provide a triplet exciton quenching site. Without wishing to be bound by any theory, it is believed that the provision of triplet quenching units at non-conjugating sites of the polymer serve to quench triplet excitons that would otherwise build up at the non-conjugating sites due to the reduced mobility of the triplet excitons at those sites.

Light-Emitting Composition

The polymer comprises both conjugating repeat units and non-conjugating, triplet quenching repeat units. The polymer may provide one or more of light-emitting, electron transporting and/or hole transporting functionality, and may comprise further repeat units to provide one or more of those functions. Alternatively, one or more of those functions may be provided by materials blended with the polymer.

For example, the polymer may comprise two or more regions selected from hole transporting regions, electron transporting regions and emissive regions as disclosed in, for example, WO 00/55927 and U.S. Pat. No. 6,353,083, and more than one function may be performed by a single region. In particular, a single region may be capable of both charge transport and emission.

Each region may comprise a single repeat unit, e.g. a triarylamine repeat unit may be a hole transporting region. Alternatively, each region may be a chain of repeat units, such as a chain of polyfluorene units as an electron transporting region. Each region within such a polymer may independently be provided along the polymer backbone, as per U.S. Pat. No. 6,353,083, or as groups pendant from the polymer backbone as per WO 01/62869.

Light-Emitting Material

The light-emitting material may be a separate material that is blended with the polymer comprising conjugating and non-conjugating repeat units. Alternatively, the light-emitting material may be provided as a repeat unit of that polymer.

Exemplary light-emitting repeat units include repeat units of formula (V):

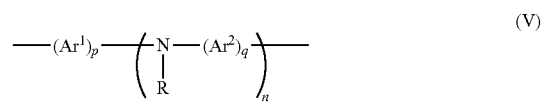

wherein $Ar^1$ and $Ar^2$ in each occurrence are independently selected from optionally substituted aryl or heteroaryl groups, n is greater than or equal to 1, preferably 1 or 2, R is H or a substituent, preferably a substituent, and p and q are each independently 1, 2 or 3.

R is preferably alkyl or —$(Ar^3)$, wherein $Ar^3$ and r are as described above.

Any of $Ar^1$, $Ar^2$ and $Ar^3$ may independently be substituted with one or more substituents. Preferred substituents are selected from $R^3$ as described above.

Any of the aryl or heteroaryl groups in the repeat unit of Formula (V) may be linked by a direct bond or a divalent linking atom or group. Preferred divalent linking atoms and groups include O, S, substituted N and substituted C.

Where present, substituted N or substituted C of the divalent linking group may independently in each occurrence be —$NR^6$— or —$CR^6_2$—.

In one preferred arrangement, R is $Ar^3$ and each of $Ar^1$, $Ar^2$ and $Ar^3$ are independently and optionally substituted with one or more $C_{1-20}$ alkyl groups.

Preferred units satisfying Formula 1 include units of Formulae 1-3:

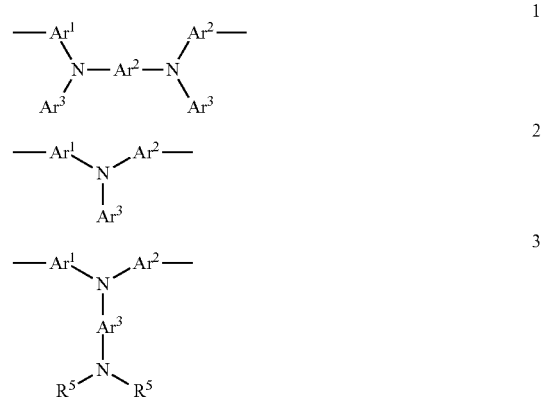

wherein $Ar^1$ and $Ar^2$ are as defined above; and $Ar^3$ is optionally substituted aryl or heteroaryl and wherein each $R^5$ is independently selected from the group consisting of alkyl and aryl or heteroaryl optionally substituted with one or more alkyl groups.

Where present, optional substituents for $Ar^3$ may be as described above with respect to formula (V).

In another preferred arrangement, aryl or heteroaryl groups of formula (V) are phenyl, each phenyl group being optionally substituted with one or more alkyl groups.

In another preferred arrangement, $Ar^1$, $Ar^2$ and $Ar^3$ are phenyl, each of which may be substituted with one or more $C_{1-20}$ alkyl groups, and r=1.

In yet another preferred arrangement, $Ar^1$, $Ar^2$ and $Ar^3$ are phenyl, each of which may be substituted with one or more $C_{1-20}$ alkyl groups, r=1 and $Ar^1$ and $Ar^2$ are linked by an O or S atom.

When used as a light-emitting material, the unit of formula (V) the proportion of arylamine repeat units may be up to about 30 mol %.

The polymer optionally is a blue light-emitting polymer, optionally a polymer that photoluminesces with a CIE(y) value of less than 0.2.

Non-Conjugating, Triplet Quenching Repeat Units

The non-conjugating, triplet quenching repeat unit reduces conjugation of the polymer as compared to a polymer in which that unit is absent, and may be provided by one or more of:

i) linking a triplet quenching repeat unit through atoms of the repeat unit such that that there is no path of alternating saturated and unsaturated bonds, in particular alternating single bonds and double bonds, between repeat units that are linked to the non-conjugating repeat unit, and ii) forming a twist between a repeat unit and at least one adjacent repeat unit such that pi orbitals of the repeat unit and the at least one adjacent repeat unit are not in the same plane, thereby reducing or eliminating overlap of pi orbitals of adjacent repeat units.

With respect to (i), this may be achieved by:
(a) providing one or more non-conjugating atoms, such as one or more sp³ hybridised carbon atoms, in the conjugation path and/or
(b) selecting the atoms through which the repeat unit is linked to adjacent repeat units such that there is no path of alternating saturated and unsaturated bonds between repeat units that are linked to the non-conjugating repeat unit.

With reference to (i)(b), the effect of selection of the linking position of a repeat unit on conjugation to adjacent repeat units is illustrated by the following:

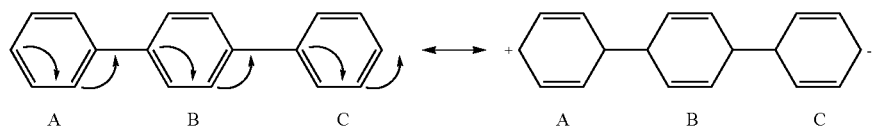

A      B      C          A      B      C

In this case, the 1,4 linkage of phenyl unit B provides for a conjugation path between units A and C, and a resonance structure of the 3 units can be drawn. If, however, linkage is through the 1,3-positions then there is no path of alternating double and single bonds between units A and C:

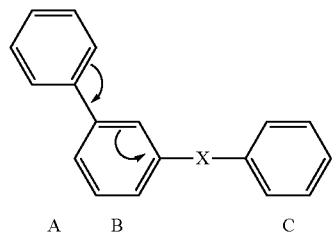

A      B      C

Therefore, it will be appreciated that while a repeat unit may itself be internally conjugated, the positions through which that repeat unit is linked may determine whether or not the repeat unit is a conjugating repeat unit providing a conjugation path between repeat units linked thereto.

With respect to (ii), this may be achieved by placing on or more substituents on a triplet quenching repeat unit so as to create steric hindrance between the triplet quenching unit and one or more adjacent repeat units so as to induce a twist. In particular, one or more substituent(s) located on an atom or atoms adjacent to a linking position of a triplet quenching unit may induce a twist between the triplet quenching unit and an adjacent unit. The substituent or substituents may be provided on the triplet quenching unit or on the adjacent unit. In one arrangement, one substituent may be on an atom of the triplet quenching unit adjacent to the linking atom of the triplet quenching unit, and one substituent may be on an atom of the adjacent unit adjacent to the linking atom of the adjacent unit so as to create steric hindrance between the two substituents.

A reduction in polymer conjugation upon introduction of a non-conjugating unit may be evidenced by any one of the following changes as compared to a polymer not comprising the non-conjugating unit: a shift in peak photoluminescent emission from the polymer towards a shorter wavelength, optionally a reduction of at least 0.01 in the polymer's photoluminescent CIE(y) value; or a reduction in electron current, which is measurable with an electron-only device.

Exemplary non-conjugating triplet quenching repeat units include aromatic or heteroaromatic compounds comprising one or more mono- or polycyclic rings non-conjugatively linked to adjacent repeat units, and optionally including one or more alkenyl or alkynyl groups, for example polyaromatic hydrocarbons such as anthracenes and anthanthrenes and derivatives thereof; distyryl aryls and derivatives thereof such as distyrylbenzenes, distyrylbiphenyls, stilbenes, fulvenes, dibenzofulvenes, linear polyenes (from 2 to 6 alkenes) including cyclic polyenes such as cyclooctatetraene and further materials described in Handbook of Photochemistry, 2$^{nd}$ Edition, Steven L Murov, Ian Carmichael and Gordon L Hug, the contents of which are incorporated herein by reference. Each said repeat unit may optionally be substituted, for example substituted with one or more groups R1 as described below with reference to repeat unit (IV). For example, each said non-conjugating triplet quenching repeat unit may be substituted with one or more alkyl groups, such as one or more $C_{1-20}$ alkyl groups.

It will be appreciated that the suitability of any given repeat unit for use as a triplet quenching repeat unit will depend on whether that unit has a triplet excited state energy level lower than that of the emitter.

A group that provides triplet-quenching functionality may itself be inserted into the polymer backbone in such a way that a break in conjugation is formed along the polymer backbone. Alternatively, the triplet-quenching group may be pendent from a unit in the polymer backbone that provides a break in conjugation, such as in a repeat unit of formula (II):

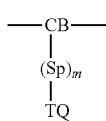

(II)

wherein CB is a conjugation breaking unit; Sp is a spacer group, such as an alkyl group, TQ is a triplet quenching group; and m is 0 or 1.

For example, the N atom(s) of the repeat unit of formula (V) form a break in conjugation along the polymer backbone and so this unit, may be substituted with any suitable triplet quenching unit to form the non-conjugating, triplet quenching unit. The substituent —(Sp)$_m$-TQ may be provided as substituent R or as a substituent of Ar$^3$ of formula (V).

The triplet quenching, non-conjugating repeat units optionally comprise at least 5 mol %, optionally at least 10 mol % of the total number of moles of repeat units in the polymer. One optional range is 15-50 mol %.

The triplet quenching, non-conjugating repeat units may have formula (I), wherein TQNC is the triplet quenching, non-conjugating repeat unit, * indicates the connecting bonds of the repeat unit θ is in the range of 120°-180°:

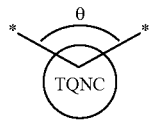

(I)

Conjugating Repeat Units

The conjugating repeat units provide at least one conjugation path between repeat units linked thereto such that the repeat units linked thereto are conjugatively linked. More specifically, each conjugating repeat unit provides a path of alternating double bonds and single bonds capable of conjugating the repeat unit to unsaturated bonds of adjacent repeat units.

The conjugating repeat units may provide one or more of hole transporting, electron transporting and light-emitting functionality.

Exemplary conjugating repeat units include optionally substituted polyarylenes or polyheteroarylenes such as: optionally substituted polyfluorenes, in particular polymers comprising 2,7-linked fluorene repeat units; polyindenofluorenes, particularly 2,7-linked polyindenofluorenes; and polyphenylenes, particularly poly-1,4-phenylenes. Another class of materials are arylene vinylenes, such as phenylene vinylenes. Such polymers are disclosed in, for example, Adv. Mater. 2000 12(23) 1737-1750 and references therein. Exemplary substituents for these repeat units include alkyl, alkoxy, alklythio, dialkylamino, and optionally substituted aryl and heteroaryl groups. Conjugated chains of arylene repeat units, for example chains of fluorene repeat units, may provide electron transporting functionality. One or more different conjugating repeat units may be provided in the polymer, for example conjugating repeat units comprising the same arylene backbone unit but with different substituents and/or different conjugating arylene backbone units.

Conjugating repeat units may optionally be provided in an amount in the range of 50-95 mol % of the total number of repeat units in the polymer, and the percentage incorporation of non-conjugating repeat units may be dependent on the percentage of conjugating repeat units present and the extent to which breaks in conjugation are required.

Particularly preferred conjugating arylene repeat units comprise optionally substituted fluorenes, such as repeat units of formula IV:

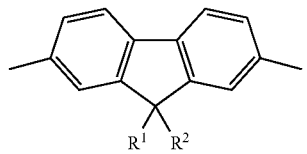

(IV)

wherein R$^1$ and R$^2$ are independently H or a substituent and wherein R$^1$ and R$^2$ may be linked to form a ring.

R$^1$ and R$^2$ are optionally selected from the group consisting of hydrogen; optionally substituted alkyl wherein one or more non-adjacent C atoms of the alkyl group may be replaced with O, S, substituted N, C=O and —COO—; and optionally substituted —(Ar$^3$)$_r$ wherein Ar$^3$ in each occurrence is independently selected from aryl or heteroaryl and r in each occurrence is independently at least 1, optionally 1, 2 or 3.

In the case where R$^1$ or R$^2$ comprises alkyl, optional substituents of the alkyl group include F, CN, nitro, and aryl or heteroaryl optionally substituted with one or more groups R$^4$ wherein each R$^4$ is independently alkyl in which one or more non-adjacent C atoms may be replaced with O, S, substituted N, C=O and —COO— and one or more H atoms of the alkyl group may be replaced with F.

In the case where R$^1$ or R$^2$ comprises aryl or heteroaryl, each aryl or heteroaryl group may independently be substituted. Preferred optional substituents for the aryl or heteroaryl groups include one or more substituents R$^3$ consisting of:

alkyl wherein one or more non-adjacent C atoms may be replaced with O, S, substituted N, C=O and —COO— and one or more H atoms of the alkyl group may be replaced with F or aryl or heteroaryl optionally substituted with one or more groups R$^4$, aryl or heteroaryl optionally substituted with one or more groups R$^4$, NR$^5$$_2$, OR$^5$, SR$^5$, and fluorine, nitro and cyano;

wherein each R$^5$ is independently selected from the group consisting of alkyl and aryl or heteroaryl optionally substituted with one or more alkyl groups.

Where present, substituted N in repeat units of formula (IV) may independently in each occurrence be NR$^5$ or NR$^6$ wherein R$^6$ is alkyl or optionally substituted aryl or heteroaryl. Optional substituents for aryl or heteroaryl groups R$^6$ may be selected from R$^4$ or R$^5$.

Optional substituents for the fluorene unit, other than substituents R$^1$ and R$^2$, are preferably selected from the group consisting of alkyl wherein one or more non-adjacent C atoms may be replaced with O, S, substituted N, C=O and —COO—, optionally substituted aryl, optionally substituted heteroaryl, fluorine, cyano and nitro.

In one preferred arrangement, at least one of R$^1$ and R$^2$ comprises an optionally substituted C$_1$-C$_{20}$ alkyl or an optionally substituted aryl group, in particular phenyl substituted with one or more $C_{1-20}$ alkyl groups.

Further Repeat Units

Further repeat units may be provided in the polymer comprising conjugating and triplet quenching, non-conjugating repeat units in order to provide one or more of hole transporting, electron transporting and light-emitting functionality.

Further repeat units suitable for inclusion in the polymer to provide hole transport and/or light-emission include arylamine repeat units, for example repeat units of formula (V) described above that are not substituted with any triplet-quenching groups.

The non-conjugating repeat units, conjugating repeat units and further repeat units described above all have only two linking positions which when polymerised together form linear polymers. However, it will be appreciated that any of these repeat units may be provided with more than two linking positions, for example in order to form starburst polymers. The maximum possible number of linking positions of a monomer will correspond to the number of polymerisable leaving groups that it is substituted with.

Relative Energy Levels and Measurement

With reference to FIG. 2, it will be appreciated that the light-emitting material has a $T_1$ level that is higher than that of the triplet-quenching non-conjugating repeat unit that it is to be used with in order that the triplet exciton may be transferred from the light-emitting material to the non-conjugating triplet quenching repeat unit.

Preferably, the $T_1$ level of the light-emitting material is at least kT higher than the $T_1$ level of the non-conjugating triplet quenching repeat unit in order to avoid back-transfer of excitons from the non-conjugating triplet quenching repeat unit to the light-emitting material.

Likewise, the $S_1$ level of the light-emitting material is preferably at least kT lower than that of the triplet quenching repeat unit.

The $T_1$ and $S_1$ levels of the triplet quenching unit can be measured from the fluorescence and phosphorescence spectra, respectively, of the monomer. The non-conjugating nature of the triplet quenching unit means that these values will not change significantly upon introduction of the unit into the polymer. Likewise, T1 and S1 levels of the polymer may be measured from their fluorescence and phosphorescence spectra. Measurement techniques are known to the skilled person as described in, for example, Y. V. Romaovskii et al, Physical Review Letters, 2000, 85 (5), p1027 and A. van Dijken et al, Journal of the American Chemical Society, 2004, 126, p7718. Additionally or alternatively, triplet energy levels of numerous materials suitable for use as the triplet quenching unit can be found in Handbook of Photochemistry, $2^{nd}$ Edition, Steven L Murov, Ian Carmichael and Gordon L Hug.

Polymer Synthesis

Preferred methods for preparation of the polymer include metal insertion polymerisations wherein the metal atom of a metal complex catalyst is inserted between an aryl or heteroaryl group and a leaving group of a monomer in order to form the desired repeat unit. Exemplary metal insertion methods are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular copolymers may be prepared when both reactive groups of a first monomer are boron and both reactive groups of a second monomer are halogen.

As alternatives to halides, other leaving groups capable of participating in metal insertion include groups include sulfonic acids and sulfonic acid esters such as tosylate, mesylate and triflate.

Polymer Tuning

The proportion of non-conjugating repeat units, conjugating repeat units and further repeat units may be selected in order to tune one or more properties of the polymer including such as colour of emission or singlet or triplet excited state energy level. On the other hand, it is preferable to keep the conductivity of the polymer as high as possible. Preferably, photoluminescent efficiency of the polymer is at least 50%, preferably at least 70%, of a corresponding polymer in which the triplet quenching, non-conjugating repeat unit is absent.

Hole Injection Layers

A conductive hole injection layer, which may be formed from a conductive organic or inorganic material, may be provided between the anode 2 and the light-emitting layer 3 to assist hole injection from the anode into the layer or layers of semiconducting polymer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Charge Transporting Layers

A hole transporting layer may be provided between the anode and the light-emitting layer. Likewise, an electron transporting layer may be provided between the cathode and the light-emitting layer.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

If present, a hole transporting layer located between anode 2 and light-emitting layer 3 preferably has a HOMO level of less than or equal to 5.5 eV, more preferably around 4.8-5.5 eV. HOMO levels may be measured by cyclic voltammetry, for example.

If present, an electron transporting layer located between light-emitting layer 3 and cathode 4 preferably has a LUMO level of around 3-3.5 eV. For example, a layer of a silicon monoxide or silicon dioxide or other thin dielectric layer having thickness in the range of 0.2-2 nm is provided between light-emitting layer 3 and layer 4.

A hole transporting layer may contain a polymer comprising hole transporting repeat units of formula (V); likewise, an electron transporting layer may contain a polymer comprising electron transporting repeat units of formula (IV).

Cathode

Cathode 4 is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of metals, for example a bilayer of a low workfunction material and a high workfunction material such as calcium and aluminium as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device may be encapsulated with an encapsulant (not shown) to preventingress of moisture and oxygen: Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Solution Processing

Suitable solvents for forming compositions of the polymer for solution processing include many common organic solvents, such as mono- or poly-alkylbenzenes such as toluene and xylene.

Particularly preferred solution deposition techniques including printing and coating techniques such spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

COMPARATIVE EXAMPLE 1

Effect of Non-Conjugating Units on OLED Lifetime

Figure 3:
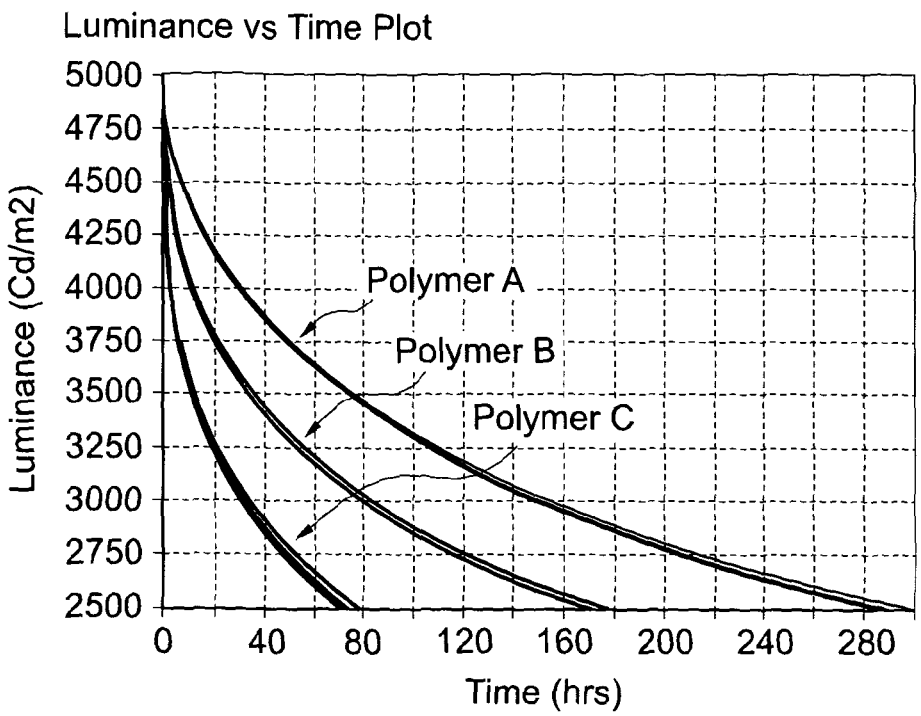
FIG. 3 illustrates lifetime of comparative devices.

FIG. 3 is a plot of luminance against time for an OLEO having the following structure:

ITO/HIL/HTL/LEP/MF/Al

Wherein ITO is indium tin oxide; HIL is a layer of hole injection material available from Plextronics Inc: HTL is a hole transporting polymer comprising fluorene repeat units and amine repeat units as described above.

LEP is a light-emitting polymer (Polymer A) comprising fluorene repeat units and less than 5 mol % amine repeat units as described above.

and the cathode is a bilayer cathode formed from a layer of metal fluoride (MF) and a layer of aluminium.

Polymer A contains no non-conjugating repeat unit (other than the small percentage of the amine emissive unit).

Corresponding polymers B and C were prepared comprising 5 and 15 mol % respectively of the following non-conjugating repeat unit:

The CIE (y) value for polymers A, B and C are 0.161, 0.161 and 0.148 respectively, illustrating the blue-shifting effect of reducing conjugation in the polymer by introduction of non-conjugating units. However, with reference to FIG. 3, it can be seen that lifetime decreases with increasing concentration of the non-conjugating repeat unit.

COMPARATIVE EXAMPLE 2

Effect of Non Conjugating Units on Triplet Exciton Density

Triplet densities were measured for polymers A and C, which have different quantities of non-conjugating repeat units as discussed above.

Figure 4:
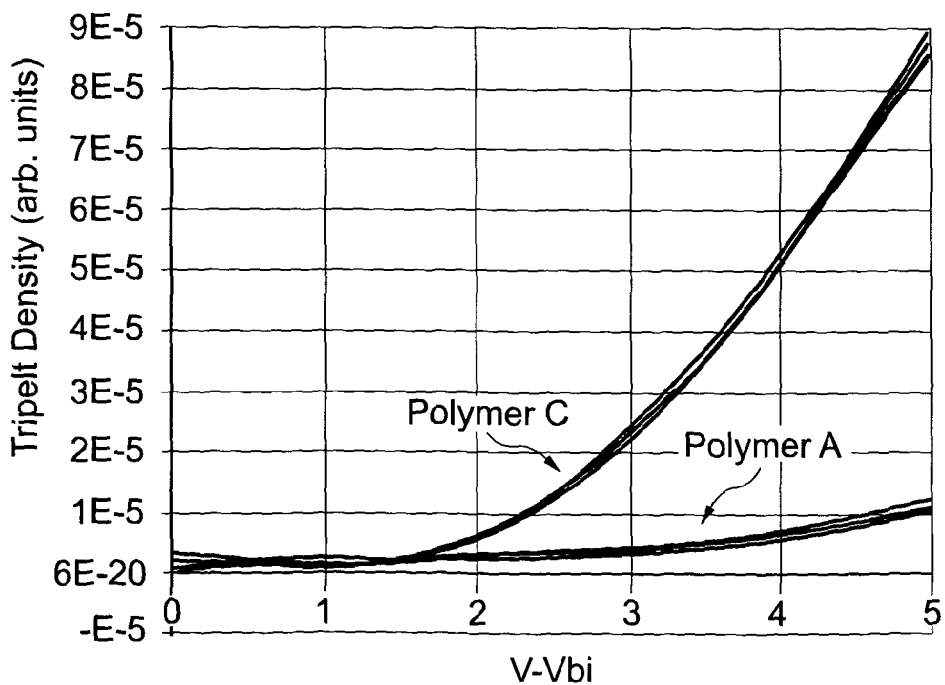
FIG. 4 illustrates triplet density of comparative devices.

It can be seen from the FIG. 4 that triplet density is much higher for the device of polymer C, which contains non-conjugating repeat units, indicating that the non-conjugating repeat units cause a build-up of triplet excitons.

COMPARATIVE EXAMPLE 3

Figure 5:
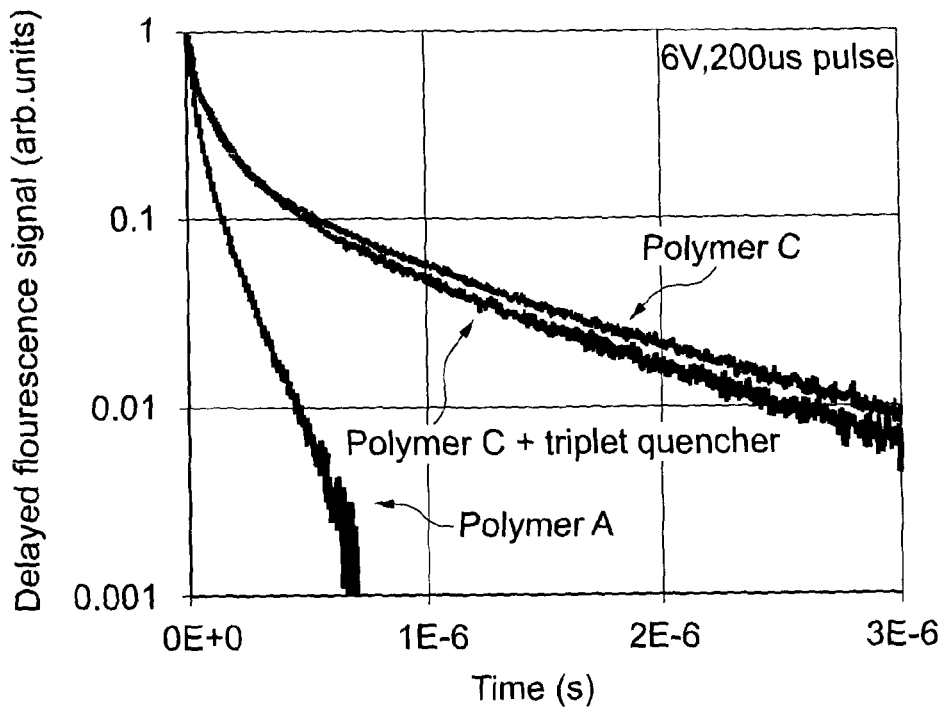
FIG. 5 illustrates delayed fluorescence from comparative devices.

Effect of Blending a Triplet-Quenching Material with a Polymer Comprising Non-Conjugating Repeat Units FIG. 5 illustrates delayed fluorescence from a device containing polymer A (which contains no non-conjugating repeat unit other than the small percentage of the amine emissive unit), polymer C (which contains 15 mol % of a non-conjugating repeat unit) and polymer C blended with a triplet quenching material.

The intensity of delayed fluorescence from an OLED may be correlated to the triplet density of that OLED because delayed fluorescence arises from triplet-triplet annihilation. It can be seen from FIG. 5 that introduction of non-conjugating repeat units into polymer A in order to form polymer C results in a significant increase in delayed fluorescence. Moreover, blending a triplet quenching material with polymer C has little effect on intensity of delayed fluorescence, indicating that blending a triplet quenching material with a polymer comprising non-conjugating units has little effect on triplet density.

Figure 6:
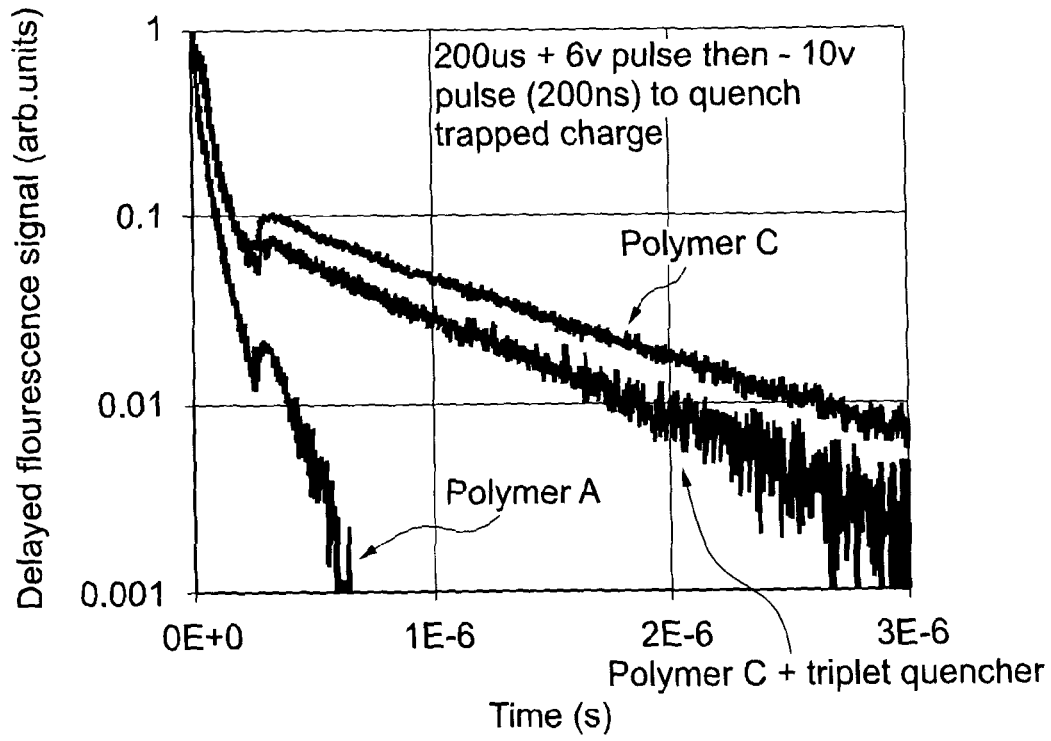
FIG. 6 illustrates delayed fluorescence with a de-trapping pulse from comparative devices.

FIG. 6 illustrates measurement of delayed fluorescence with a de-trapping pulse to release any trapped charge FIG. 6 is very similar to FIG. 5, indicating that the delayed fluorescence illustrated in FIG. 5 is not due to recombination of de-trapped charge but is in fact due to triplet-triplet annihilation.

Example 1

An OLED was prepared as described above in Comparative Example 1, except that 15 mol % of a non-conjugating, triplet quenching repeat unit was incorporated into the polymer.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:
1. A light-emitting polymer comprising at least one conjugating repeat unit, a repeat unit of formula (II), and a fluorescent light-emitting repeat unit in a backbone of the polymer, wherein:
the conjugating repeat unit comprises a repeat unit of formula (IV):

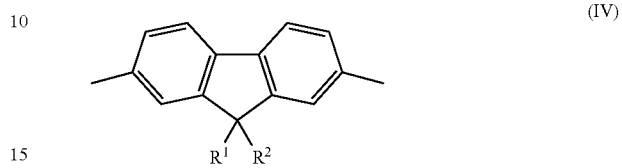

(IV)

wherein $R^1$ and $R^2$ are independently H or a substituent or wherein $R^1$ and $R^2$ may be linked to form a ring, wherein the conjugating repeat unit is provided in an amount in the range of 50-95 mol % of the total number of repeat units in the polymer;
the repeat unit of formula (II) is linked to adjacent repeat units such that there is no conjugating path of alternating saturated and unsaturated bonds between the adjacent repeat units:

(II)

wherein CB is a 1,3-linked phenylene unit; Sp is a spacer group, TQ is a triplet quenching group which non-radiatively quenches triplet excitons; and m is 0 or 1;
a triplet excited state energy level of the fluorescent light-emitting repeat unit is higher than a triplet excited state energy level of the repeat unit of formula (II);
the fluorescent light-emitting repeat unit has the structure of formula (V):

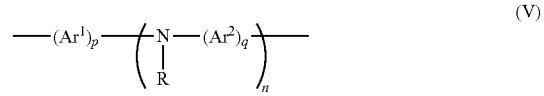

(V)

wherein $Ar^1$ and $Ar^2$ in each occurrence are independently optionally substituted aryl or heteroaryl; n is greater than or equal to 1; p is 1, 2, or 3; q is 1, 2, or 3; R is $(Ar^3)r$, wherein each $Ar^3$ independently represents an aryl or heteroaryl group which is unsubstituted or substituted with one or more $C_{1-20}$ alkyl groups, and r is at least 1; and any aryl or heteroaryl groups of the repeat unit of formula (V) may be linked to one another by a direct bond or a divalent group;
wherein the only arylamine repeat unit that the polymer comprises is the repeat unit of formula (V); and wherein the polymer is a random copolymer; and
wherein the conjugating repeat units are conjugated to, and provide at least one conjugation path between, repeat units linked thereto.
2. A light-emitting polymer according to claim 1, wherein the repeat unit of formula (II) is twisted out of the plane of at least one adjacent repeat unit.

3. A light-emitting polymer according to claim 1, wherein the repeat unit of formula (II) does not comprise perylene.

4. A light-emitting polymer according to claim 1, wherein the repeat units of formula (II) comprise at least 5 mol % of the total number of repeat units in the polymer.

5. A light-emitting polymer according to claim 1, wherein the polymer comprises at least two different conjugating repeat units.

6. An organic light-emitting device comprising an anode, a cathode and a light-emitting layer between the anode and the cathode wherein the light-emitting layer comprises a light-emitting polymer according to claim 1.

7. A light-emitting polymer according to claim 1, wherein the polymer consists of the at least one conjugating repeat unit, the repeat unit of formula (II), and the fluorescent light-emitting repeat unit.

8. The light-emitting polymer of claim 1, wherein the polymer emits blue fluorescent light.

9. A method of forming a light-emitting polymer according to claim 1, comprising the steps of polymerising a polymerisation mixture comprising a monomer comprising a conjugating unit and a monomer comprising a unit of formula (II).

10. A method according to claim 9 wherein the polymerisation mixture comprises a monomer comprising a light-emitting unit.

11. A method according to claim 9 wherein the polymerisation is a metal insertion polymerisation wherein each monomer comprises at least two leaving groups capable of participating in the metal insertion polymerisation.

12. A method according to claim 11 wherein each leaving group is independently selected from halogen; a boronic acid or an ester thereof; and a sulfonic acid or a derivative thereof.

* * * * *